United States Patent [19]

Hunt

[11] Patent Number: 4,873,199

[45] Date of Patent: Oct. 10, 1989

[54] METHOD OF MAKING BIPOLAR INTEGRATED CIRCUITS

[75] Inventor: Rowland G. Hunt, Ipswich, Great Britain

[73] Assignee: STC PLC, London, England

[21] Appl. No.: 249,205

[22] Filed: Sep. 23, 1988

Related U.S. Application Data

[63] Continuation of Ser. No. 23,223, Mar. 9, 1987, abandoned.

[30] Foreign Application Priority Data

Mar. 26, 1986 [GB] United Kingdom ............. 8607593

[51] Int. Cl.$^4$ .............................................. H01L 21/265
[52] U.S. Cl. ........................................ 437/31; 437/33; 437/26; 357/59; 357/34; 148/DIG. 124
[58] Field of Search ............... 437/31, 32, 33, 26, 437/233, 27, 186, 228; 357/59 H, 34

[56] References Cited

U.S. PATENT DOCUMENTS

| | | | |
|---|---|---|---|
| 4,151,009 | 4/1979 | Agureck | 437/31 |
| 4,573,064 | 2/1986 | McLevige | 437/33 |
| 4,667,218 | 5/1987 | Takahashi | 437/31 |

FOREIGN PATENT DOCUMENTS 2106319 4/1983 United Kingdom .

OTHER PUBLICATIONS

Nakashiba "An Advanced—" IEEE J. Solid State Circuits vol. SC-15 #4, 8/80, 455-459.
Cuthbertson et al, IEDM 1984, pp. 749-752 "Self Aligned Bipolar".

Primary Examiner—Brian E. Hearn
Assistant Examiner—Kevin McAndrews
Attorney, Agent, or Firm—Lee, Mann, Smith, McWilliams & Sweeney

[57] ABSTRACT

A well structure for a semiconductor device has a dopant profile such that the maximum net dopant level is below the device surface. This is achieved by a two stage doping with materials of opposite conductivity type.

5 Claims, 3 Drawing Sheets

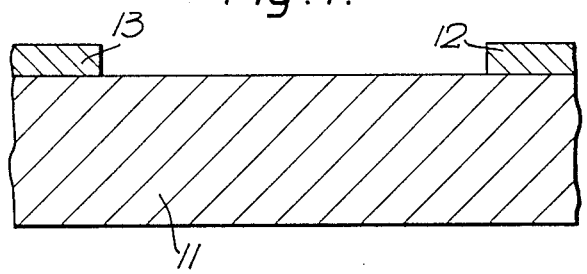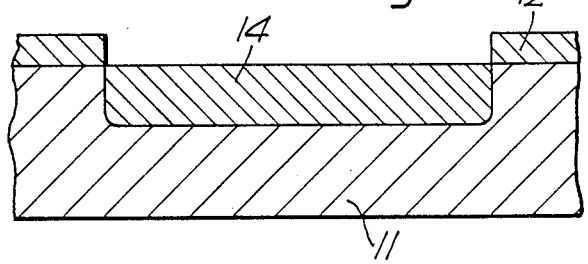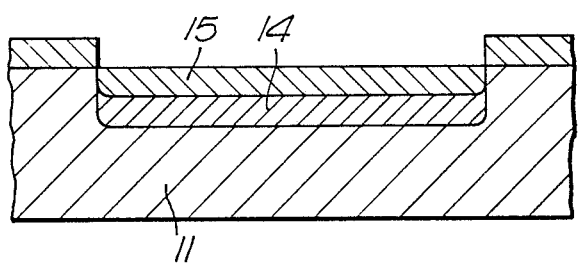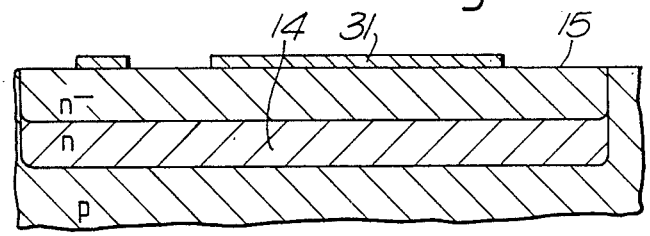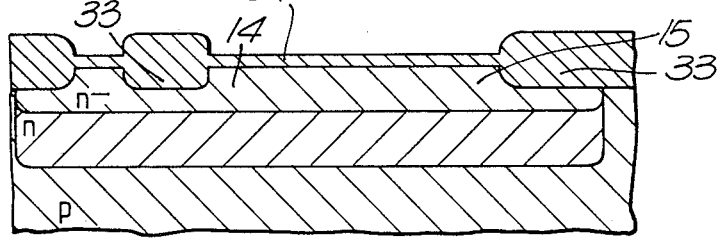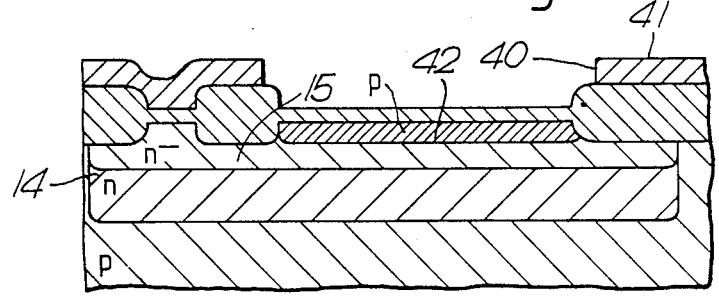

METHOD OF MAKING BIPOLAR INTEGRATED CIRCUITS

This application is a continuation of application Ser. No. 23,223, filed Mar. 9, 1987, now abandoned.

This invention relates to integrated circuits and in particular to the formation of doped wells in such circuits.

BACKGROUND OF THE INVENTION

Semiconductor integrated circuits are provided with doped wells in the substrate surface whereby the various devices comprising the circuit are isolated. Where the circuit includes bipolar devices, the electrical characteristics of these devices are partly determined by the doping of the wells. The wells are conventionally formed by contacting the semiconductor surface with a dopant, or by ion implanting a dopant, followed by a thermal drive in to the required depth. The two techniques produce slightly different profiles, but in both cases the dopant concentration is highest adjacent the surface. Such a dopant distribution is less than ideal for bipolar devices. To reduce collector resistance it is necessary to provide a high dopant concentration, but the associated high concentration at the surface can then lead to breakdown. In most applications therefore, a compromise dopant level must be provided which gives acceptable values for both resistance and breakdown voltage. This of course can be difficult to achieve on a reproducible basis thus leading to a spread of device characteristics. Processes for forming bipolar and field effect transistors are described in our UK specifications Nos. 2,173,638 (U.S. Ser. No. 836,685, filed Mar. 6, 1986) and 2,173,744 (U.S. Ser. No. 831,257) and in our UK patent application No. 8607594 (U.S. Ser. No. 27,870, filed Mar. 19, 1987).

The object of the invention is to minimise or to overcome this disadvantage.

SUMMARY OF THE INVENTION

According to one aspect of the invention there is provided a method of forming a doped well in a major surface of a semiconductor substrate, the method including introducing a first dopant into the well region, and introducing a second dopant or opposite conductivity type to the first dopant into the surface of the well region, whereby partial compensation of the dopants is effected such that the net maximum concentration is disposed below the surface.

According to another aspect of the invention there is provided a method of forming a doped well in a major surface of a silicon substrate, the method including implanting phosphorus ions into the substrate in the well region, heating the substrate to drive in the implant, implanting boron ions into the well region, and heating the substrate to drive in the boron ion implant, and wherein the relative implanted doses of the two ions are such that partial compensation of the dopants is effected within the well region.

According to a further aspect of the invention there is provided a method of fabricating a bipolar polysilicon emitter transistor, the method including providing in a substrate a doped well wherein the net maximum dopant concentration is disposed below the semiconductor surface, forming a base region, providing a polysilicon emitter in contact with the base regions, implanting base contact regions adjacent the base region, said emitter providing a mask whereby the implantations are aligned, providing a collector contact region, and applying metal contacts to the collector contact region and to the base and emitter.

By providing compensation of the dopants, the breakdown voltage of a bipolar transistor formed in the well is maintained whilst the collector resistance is insignificantly reduced.

BRIEF DESCRIPTION OF THE DRAWINGS

An embodiment of the invention will now be described with reference to the accompanying drawings in which:

FIGS. 1 to 3 show successive stages in the fabrication of a doped well in a semiconductor substrate;

FIGS. 5 to 10 illustrate the fabrication of a bipolar transistor in the well of FIGS. 1 to 3.

DESCRIPTION OF PREFERRED EMBODIMENT

Figure 4:
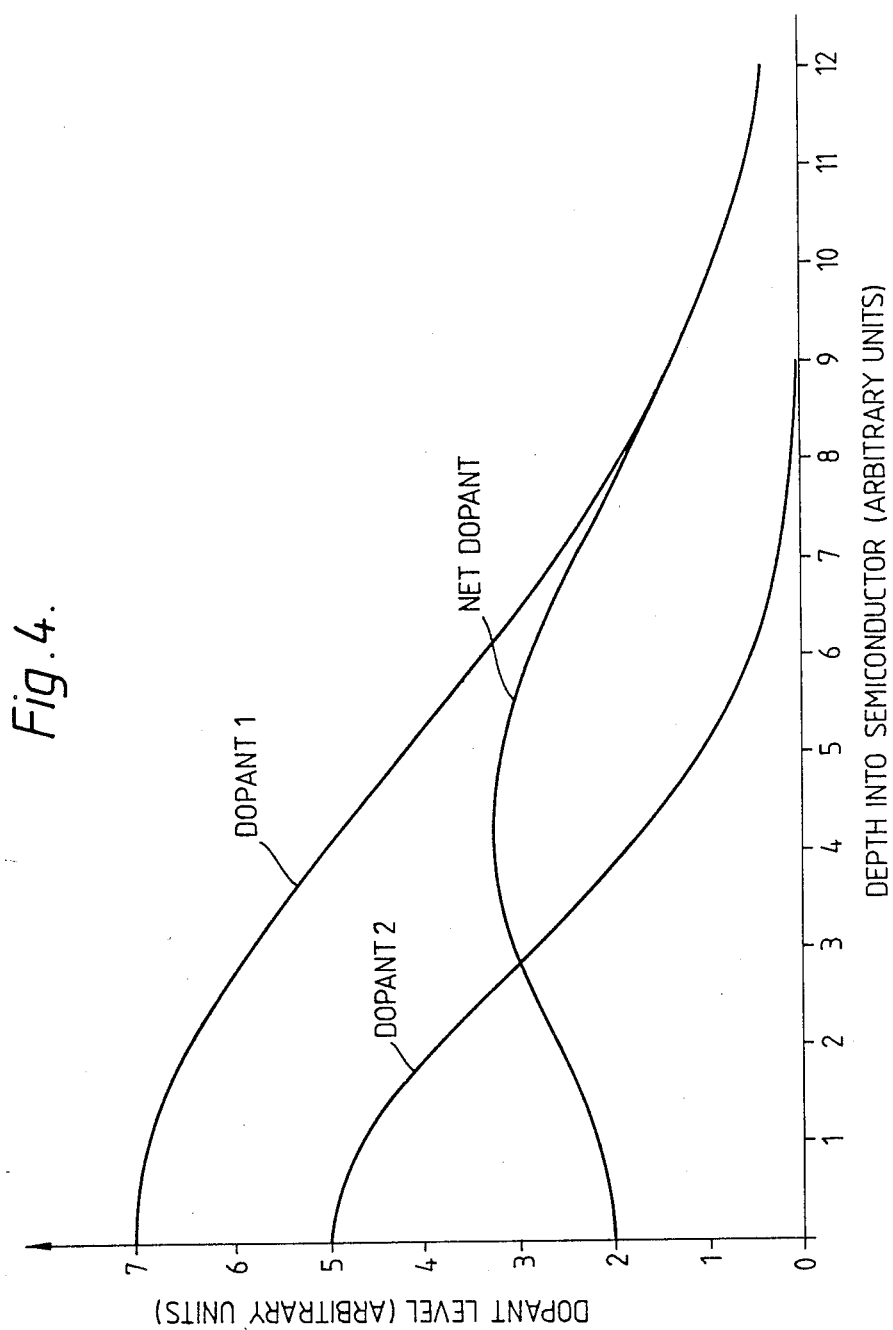
FIG. 4 illustrates the doping profile provided by the compensated doping technique.

Referring to FIGS. 1 to 3, a semiconductor, e.g. silicon, substrate 11 (FIG. 1) is provided with a mask 12 having an opening 13 defining the position of the well to be fabricated. A first dopant is applied, e.g. as an ion implant, at a relatively high concentration and is driven in to form a well 14 (FIG. 2). Typically this first dopant is of the opposite conductivity type to the substrate. A second dopant of opposite conductivity type to the first dopant and at a lower concentration is next applied and driven in to define a region 15 (FIG. 3) wherein compensation of the two dopants is effected to produce a low net dopant concentration level. Typically the second dopant is applied as an ion implant. Advantageously, the dopant ions are implanted at energies of 50 to 200 keV, each implantation being followed by a thermal drive-in to distribute that dopant. Thermal drive-in may be effected by maintaining the semiconductor body at a temperature of 1100° to 1200° C. for a period of several hours. The precise drive-in conditions will of course depend on the dopant concentrations and well depth.

A typical net dopant profile obtained in this way is shown in FIG. 4 of the accompanying drawings. As can be seen from FIG. 4, the net maximum dopant concentration occurs well below the semiconductor surface thus providing in effect a buried layer. The net surface dopant concentration is typically between $1.5 \times 10^{15}$ and $1.5 \times 10^{16}$ cm$^{-3}$. The peak net dopant concentration may be approximately three times the surface value, i.e. between $4.5 \times 10^{15}$ and $4.5 \times 10^{16}$ cm$^{-3}$ and is generally provided at a depth of 2 to 5 microns. The total well depth is generally from 4 to 10 microns.

Generally the second dopant is implanted at a higher energy than the first dopant. Thus, the first dopant may be implanted at an energy of 100 to 150 keV and the second dopant at 150 to 200 keV.

The dopant concentration is determined from the implanted dose and the well depth. Dividing the dose by the well depth gives an average dopant concentration for the well region.

Where the well is to be used for a bipolar transistor, this doping profile considerably eases the design constraints. Thus, a highly doped low resistance buried collector may be provided whilst the effective doping at the surface is sufficiently low to minimise the risk of breakdown. The first dopant may comprise arsenic or phosphorus and the second dopant may comprise boron.

The well structure may be used in a variety of applications. However it is of particular application in providing isolation for polysilicon emitter transistors, e.g. in the fabrication of an integrated circuit having both bipolar and CMOS devices on a single semiconductor chip.

Figure 8:
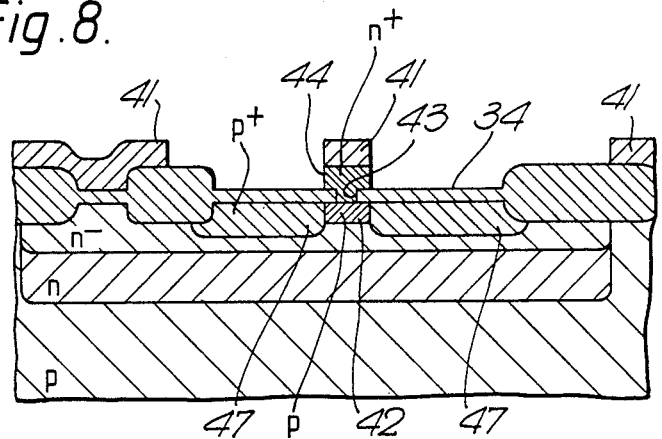
Figure 9:
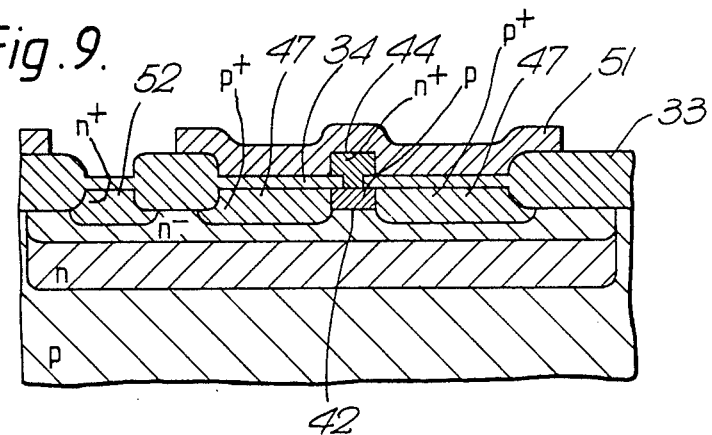

A typical fabrication sequence for forming a bipolar transistor in the well of FIG. 1 to 3 is shown in FIGS. 5 to 9. It is assumed that the well is n-type but it will be clear that an analogous process can be carried out with materials of the opposite conductivity types. Using a mask (not shown) a layer of silicon nitride 31 (FIG. 5) deposited on the substrate is patterned to distinguish between active areas and those areas where oxide is to be formed. The substrate is then oxidised to form field oxide 33 (FIG. 6) in the unprotected area. The nitride layer is removed and the substrate is oxidised to grow thin oxide 34 between the field oxide areas 33. A photoresist layer 41 (FIG. 7) is applied and a window 40 is defined therein. Through this window 40 a p-type dopant, e.g. boron, is ion implanted to form the p-type layer 42. The central part of this layer will ultimately form the base region of the transistor. Using a further mask (not shown) a window 43 (FIG. 8) is opened in the oxide 34 covering the p-type layer 42. A layer of undoped polysilicon is deposited and ion implanted e.g. with As or P to form n+-type material. This layer is then patterned to define the polysilicon emitter 44 (FIG. 8). The assembly is then heated in an oxidising atmosphere to grow a thick oxide layer 61 over the p-doped polysilicon emitter 44. Using this oxide layer as a mask, a p-type dopant, e.g. boron is implanted to define p+-type base contact regions 47. The thick oxide layer 61 over the emitter 44 stops implantation into the underlying polysilicon.

Figure 10:
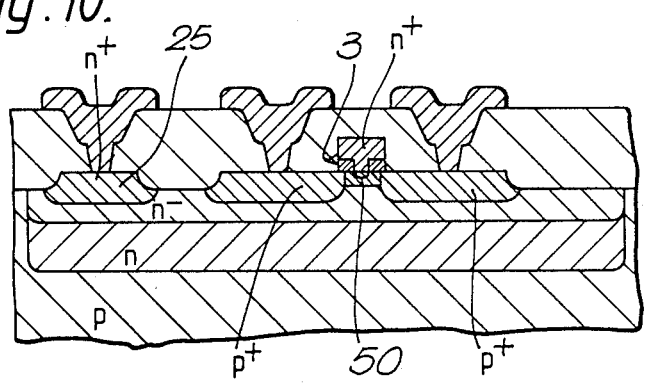

Using a further mask, a layer of photoresist 51 (FIG. 9) is patterned to define a window 49 whereby an n-type dopant, e.g. arsenic, is implanted to form an n+ collector contact 52. The mask 51 is removed and thermal drive-in of the implanted regions is effected. During this drive-in, out diffusion from the emitter into the base region 42 occurs to form a p-type region 50 (FIG. 10) in the p-type layer 42 immediately below the emitter 44. Finally the wafer is oxidised and metallised to provide contacts 54 (FIG. 10) to the collector, base and emitter of the device.

The following example illustrates the invention.

Doped wells were found in a silicon substrate wafer using the process described herein. Phosphorus (p+) ions were implanted at an energy of 100 keV and at a total dose of $7.7 \times 10^{12}/cm^2$. The dopant was then driven in by heating the silicon substrate to a temperature of 1175° C. for a period of 19 hours. This diffused the dopant to a depth of 8.2 microns.

The phosphorus doping was compensated by implantation of a second dopant of the opposite conductivity type. This comprised an implant of boron (B+) ions at an energy of 160 keV and a total dose of $2.8 \times 10^{12}/cm^2$. Drive-in of the second dopant was effected by heating at a temperature of 1175° C. for a period of 3 hours.

Bipolar transistors were next formed in the wells using the process described herein with reference to FIGS. 5 to 9 of the accompanying drawings. The average collector resistance for these transistors was found to be 200 ohms, and the average breakdown voltage was 30.1 volts.

By way of comparison, similar bipolar transistors were formed in conventional (uncompensated) wells in a silicon substrate. These wells were formed by implanting phosphorus (p+) ions at an energy of 100 keV and a dose of $5.1 \times 10^{12}/cm^2$ followed by a drive-in for 45 hours at a temperature of 1175° C. The depth of the wells was 9.9 microns.

The average collector resistance of these transistors was 344 ohms and the breakdown voltage was 29.8 volts.

Thus, it can be seen that the process described herein provides a significant reduction in collector resistance whilst maintaining the breakdown voltage at a suitable level.

Bipolar transistors of the type described herein require only two masks additional to a conventional CMOS process. Thus this approach to the integration of bipolar and CMOS technologies provides devices capable of high performance analogue and digital functioning, the bipolar and CMOS transistors being formed simultaneously on the same chip. It will however be understood that the invention is not limited to this particular application.

I claim:

1. A method of fabricating a bipolar polysilicon emitter transistor in a single crystal substrate, the method including defining a doped well in the substrate by implanting phosphorus dopant ions at a dose of about $7.7 \times 10^{12}/cm^2$ into the well region at an energy of about 100 KeV and heating the substrate to drive in the dopant, implanting boron ions at a dose of about $2.8 \times 10^{12}/cm^2$ and at an energy of about 160 KeV and further heating the substrate to drive in the boron dopant and to effect compensation between the two dopants whereby the peak net dopant concentration is disposed at a depth of 2 to 5 microns below the substrate surface, implanting boron ions into the well thus forming to define a p-type base layer depositing a body of undoped polysilicon on a selected area of the base layer so as to define a polysilicon emitter, providing an oxide coating on the polysilicon emitter body, implanting boron ions into the base layer to define p+-type base contact regions, and oxide layer on the emitter body providing a mask whereby the base contact regions are aligned with the emitter body and whereby implantation into the emitter body is inhibited, implanting an n-type dopant into the well to provide a collector contact, heating the substrate to drive in the implanted base contact regions and collector contact, and applying metal contacts to the collector contact, the base contact regions and the polysilicon emitter body.

2. A method of fabricating a bipolar polysilicon emitter transistor in a doped well in a single crystal silicon substrate, the method including the steps of:
  implanting phosphorus ions into a well region at an energy of about 100 KeV and a dose of about $7.7 \times 10^{12}/cm^2$;
  heating the substrate to a temperature of about 1175° C. to drive in the dopant;
  implanting boron ions into said well region at an energy of about 160 KeV and a dose of about $2.8 \times 10^{12}/cm^2$;
  further heating the substrate to a temperature of about 1175° C. to drive in the boron dopant and to effect compensation between the phosphorus and boron dopants providing a peak dopant concentration of $4.5 \times 10^{15}$ cm$^{-3}$ to $4.5 \times 10^{16}$ cm$^{-3}$ at a depth of 2 to 5 microns below the substrate surface;

providing a field oxide pattern having first and second openings over said doped well;

providing a thin oxide layer in said first and second openings;

impanting boron ions into said doped well via said first opening to define a p-type base layer;

providing a further opening a said field oxide over a central region of said base layer, said central region ultimately becoming a base region of the transistors;

providing a polysilicon emitter body on the base region in register with said further opening and in contrast with the base region via that opening;

heating structure to provide an oxide film on the polysilicon emitter body;

implanting boron ions via said first openings, the oxide on the emitter body providing an implantation mask whereby to define, in said first opening, p+-type base contact regions aligned with the polysilicon emitter body, and whereby to inhibit implantation of ions into the emitter body;

implanting arsenic ions via said second opening to form an n+-type collector contact;

heating the structure to drive in the implanted base contact regions and collector contact;

and applying metal contacts to the collector contact, the base contact regions and to the polysilicon emitter body.

3. A method as claimed in claim 2, wherein the net surface dopant level is from $1.5 \times 10^{15}$ to $1.5 \times 10^{16}$ cm$^{-3}$.

4. A method as claimed in claim 3 wherein the maximum net dopant level is from $4.5 \times 10^{15}$ to $4.5 \times 10^{16}$ cm$^{-3}$.

5. A method as claimed in claim 4, wherein the maximum net dopant level is at a depth of 2 to 3 microns below the semiconductor surface.

* * * * *